United States Patent
Joshi (10) Patent No.: US 9,803,938 B2
(45) Date of Patent: Oct. 31, 2017

(54) COOLING ASSEMBLIES HAVING POROUS THREE DIMENSIONAL SURFACES

(71) Applicant: Toyota Motor Engineering & Manufacturing North America, Inc., Erlanger, KY (US)

(72) Inventor: Shailesh N. Joshi, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 270 days.

(21) Appl. No.: 13/935,800

(22) Filed: Jul. 5, 2013

(65) Prior Publication Data
US 2015/0007965 A1   Jan. 8, 2015

(51) Int. Cl.
*F28F 13/18*   (2006.01)
*F28F 21/08*   (2006.01)
(Continued)

(52) U.S. Cl.
CPC ............ *F28F 13/185* (2013.01); *F28F 1/122* (2013.01); *F28F 21/089* (2013.01);
(Continued)

(58) Field of Classification Search
CPC ........ F28F 13/18; F28F 13/185; F28F 21/089; H05K 7/20; H05K 7/20345; H01L 23/4735
(Continued)

(56) References Cited

U.S. PATENT DOCUMENTS

| 4,583,582 A | 4/1986 | Grossman |
| 5,067,047 A | 11/1991 | Azar |

(Continued)

FOREIGN PATENT DOCUMENTS

| JP | 10121110 | 5/1998 |
| WO | 98/44307 | 10/1996 |
| WO | WO2005029555 | 3/2005 |

OTHER PUBLICATIONS

Amon, Cristina H., S. C. Yao, C.F. Wu, and C. C. Hsieh. "Microelectromechanical System-Based Evaporative Thermal Management of High Heat Flux Electronics." Journal of Heat Transfer, 2005:66-75.

(Continued)

*Primary Examiner* — Davis Hwu
*Assistant Examiner* — Gustavo Hincapie Serna
(74) *Attorney, Agent, or Firm* — Dinsmore & Shohl LLP (57) ABSTRACT

Cooling assemblies including a porous three dimensional surface such as a heat sink are disclosed. In one embodiment, a cooling assembly includes a heat transfer substrate having a surface, a thermally conductive fin extending from the surface, a metal mesh bonded to a surface of the thermally conductive fin, and sintered metal particles bonded to the metal mesh and the surface of the thermally conductive fin. The metal mesh defines a macro-level porosity, and the sintered metal particles define a micro-level porosity. In another embodiment, a cooling assembly includes a heat transfer substrate having a surface, a thermally conductive fin extending from the surface of the heat transfer substrate, and sintered metal particles bonded to the surface of the thermally conductive fin. An average diameter of the sintered metal particles increases from a base of the thermally conductive fin to a top of the thermally conductive fin.

21 Claims, 10 Drawing Sheets

(51) Int. Cl.
*F28F 1/12* (2006.01)
*H01L 23/373* (2006.01)
*H01L 23/473* (2006.01)
*H01L 21/48* (2006.01)
*F28F 13/00* (2006.01)

(52) U.S. Cl.
CPC ...... *H01L 21/4882* (2013.01); *H01L 23/3733* (2013.01); *H01L 23/4735* (2013.01); *F28F 13/003* (2013.01); *H01L 2924/0002* (2013.01)

(58) Field of Classification Search
USPC ......... 165/907, 146, 104.26, 80.4, 133, 908; 361/700, 699
See application file for complete search history.

(56) References Cited

U.S. PATENT DOCUMENTS

| | | | |
|---|---|---|---|
| 5,402,004 | A | 3/1995 | Ozmat |
| 6,108,201 | A * | 8/2000 | Tilton et al. ................. 361/689 |
| 6,123,145 | A | 9/2000 | Glezer et al. |
| 6,360,814 | B1 * | 3/2002 | Tanaka ................ F28D 15/0266 165/104.21 |
| 6,498,725 | B2 * | 12/2002 | Cole et al. .................... 361/700 |
| 6,952,346 | B2 | 10/2005 | Tilton et al. |
| 6,986,382 | B2 | 1/2006 | Upadhya et al. |
| 6,988,535 | B2 | 1/2006 | Upadhya et al. |
| 7,044,199 | B2 * | 5/2006 | Thayer et al. ................ 165/80.4 |
| 7,078,803 | B2 * | 7/2006 | Tilton ....................... F28D 5/00 165/80.4 |
| 7,229,542 | B2 * | 6/2007 | Bang ................. B81C 99/0085 205/67 |
| 7,277,283 | B2 | 10/2007 | Campbell et al. |
| 7,281,573 | B2 * | 10/2007 | Tsai ............................. 165/185 |
| 7,331,377 | B1 * | 2/2008 | Toy .............................. 165/80.4 |
| 7,375,962 | B2 | 5/2008 | Campbell et al. |
| 7,511,957 | B2 | 3/2009 | Campbell et al. |
| 7,530,778 | B2 | 5/2009 | Yassour et al. |
| 7,571,618 | B2 | 8/2009 | Dessiatoun |
| 7,597,135 | B2 | 10/2009 | Ghosh et al. |
| 7,639,030 | B2 | 12/2009 | Wadell |
| 7,755,185 | B2 * | 7/2010 | Bayerer ................ H01L 23/373 257/714 |
| 7,762,314 | B2 | 7/2010 | Campbell et al. |
| 7,791,884 | B2 * | 9/2010 | Huang ............... H05K 7/20936 165/104.21 |
| 7,836,597 | B2 * | 11/2010 | Datta ....................... F04B 17/00 165/104.33 |
| 7,841,843 | B2 | 11/2010 | Cho et al. |
| 7,885,074 | B2 | 2/2011 | Campbell et al. |
| 7,921,664 | B2 | 4/2011 | Rini et al. |
| 7,942,997 | B2 | 5/2011 | Rivas et al. |
| 7,992,626 | B1 * | 8/2011 | Tilton et al. ................. 165/80.4 |
| 7,992,627 | B2 | 8/2011 | Bezama et al. |
| 8,043,382 | B2 * | 10/2011 | Kumar ................ A61F 2/30965 623/23.54 |
| 8,059,405 | B2 | 11/2011 | Campbell et al. |
| 8,074,706 | B2 | 12/2011 | Su et al. |
| 8,077,460 | B1 | 12/2011 | Dede et al. |
| 8,081,461 | B2 | 12/2011 | Campbell et al. |
| 8,118,084 | B2 | 2/2012 | Harvey |
| 8,194,406 | B2 | 6/2012 | Campbell et al. |
| 8,391,008 | B2 | 3/2013 | Dede |
| 8,528,628 | B2 * | 9/2013 | Robinson .................. F28F 3/12 165/104.31 |
| 2003/0118827 | A1 * | 6/2003 | Pinneo ................. B23K 1/0008 428/408 |
| 2006/0157225 | A1 * | 7/2006 | Martin .................. H01L 23/473 165/80.4 |
| 2006/0175044 | A1 * | 8/2006 | Lee et al. ................. 165/104.26 |
| 2007/0084587 | A1 | 4/2007 | Huang et al. |
| 2007/0119565 | A1 | 5/2007 | Brunschwiler et al. |
| 2008/0230208 | A1 * | 9/2008 | Rasmussen .................. 165/80.4 |
| 2010/0044018 | A1 | 2/2010 | Furberg et al. |
| 2010/0097760 | A1 | 4/2010 | Azar et al. |
| 2011/0146955 | A1 | 6/2011 | Chen |
| 2011/0220328 | A1 * | 9/2011 | Huang ................ F28D 15/0241 165/104.26 |
| 2011/0272120 | A1 | 11/2011 | Joshi et al. |
| 2012/0097368 | A1 | 4/2012 | Chen et al. |
| 2012/0168145 | A1 | 7/2012 | Peterson et al. |
| 2012/0170222 | A1 | 7/2012 | Dede |
| 2012/0175084 | A1 * | 7/2012 | Horng ..................... F28D 15/02 165/104.26 |
| 2012/0181005 | A1 | 7/2012 | Downing |
| 2012/0212907 | A1 | 8/2012 | Dede |
| 2012/0279684 | A1 | 11/2012 | Keisling et al. |
| 2013/0020059 | A1 | 1/2013 | Park |
| 2013/0048251 | A1 * | 2/2013 | Xiao ..................... H01L 23/427 165/104.26 |
| 2014/0082942 | A1 * | 3/2014 | Campbell .............. H05K 7/203 29/890.03 |

OTHER PUBLICATIONS

Brignoni, L., Garimella, S., "Performance Characteristics of Confined Impinging Air Jets with Surface Enhancement," Advances in Electronic Packaging, vol. 26-2, 1999: 2009-2014.

El-Sheikh, H., Garimella, S., "Heat Transfer from Pin-Fin Heat Sinks under Multiple Impinging Jets," IEEE Transactions on Advanced Packaging, vol. 23-1, 2000: 113-120.

http://academiccommons.columbia.edu/catalog/ac%3A131465; "Micro-Evaporator Design and Investigation of Phase Change in Tailored Microchannels"; Selin Arslan; Graduate School of Arts and Sciences, Columbia University, 2011.

http://digitalcommons.mcmaster.ca/cgi/viewcontent.cgi?article=7365&context=opendissertations; "Effect of surface finish on boiling heat transfer at stagnation point under free liquid jet impingement".

http://www.sciencedirect.com/science/article/pii/S0017931098003378; "An experimental study of slot jet impingement cooling on concave surface: effects of nozzle configuration and curvature".

Lay, J. H., and V.K. Dhir. "Nucleate Boiling Heat Flux Enhancement on Macro/Micro-Structured Surfaces Cooled by an Impinging Jet." Journal of Enhanced Heat Transfer, 1995: 177-88.

Sung, M. K., Mudawar, I., "Single-phase and two-phase cooling using hybrid micro-channel/slot-jet module." Int. J. of Heat and Mass Transfer, 51, 2008: 3825-2839.

https://engineering.purdue.edu/CTRC/research/projects/A_JetImpingement_oneslider2011.pdf; "Two-Phase Liquid Jet Impingement Cooling"; S. V. Garimella, D.A. West; Purdue University, Cooling Technologies Research Center.

https://www.lboro.ac.uk/research/iemrc/documents/EventsDocuments/3rd%20conference%202008/Presentations/opt%20cooling%20Skuriat%20notts.pdf; "Optimum Cooling Solutions for Power Electronics"; Robert Skuriat, Nottingham University, Jul. 4, 2008.

Brunschwiler, T., H. Rothuizen, M. Fabbri, U. Kloter, B. Michel, R.J. Benzama, and G. Natarajan. Direct Liquid Jet-Impingement Cooling With Micron-Sized Nozzle Array and Distributed Return Architecture. Proc. of The Tenth Intersociety Conference on Thermal and Thermomechanical Phenomena in Electronics Systems, San Diego, CA, 2006: 196-203.

Wadsworth, D.C., Mudawar, I., "Cooling of a Multichip Electronic Module by Means of Confined Two-Dimensional jets of dielectric liquid," Transactions of the ASME Journal of Heat Transfer, vol. 112, 1990: 891-898.

Notice of Allowance relating to U.S. Appl. No. 13/734,710, dated Oct. 2, 2013.

U.S. Appl. No. 13/683,660, filed Nov. 21, 2012 entitled "Cooling Apparatuses Having Sloped Vapor Outlet Channels".

Z. Q. Chen et al., "An experimental study of two phase flow and boiling heat transfer in bi-dispersed porous channels," available at http://www.me.ust.hk/~mezhao/pdf/49.PDF.

(56) References Cited

OTHER PUBLICATIONS

Palm et al., "Enhancement of Boiling Heat transfer by Application of a Porous Layer," available at: http://www.energy.kth.se/index.asp?pnr=10&ID=125&lang=0.
Zhao, Zenghui, "Enhanced heat transfer with jet impingement on structured-porous surfaces," available at http://ieeexplore.ieee.org/xpl/login.jsp?tp=&arnumber=6231577&url=http%3A%2F%2Fieeexplore.ieee.org%2Fxpls%2Fabs_all.jsp%3Farnumber%3D6231577.
J. P. Li, et al., Porous Ti6Al4V scaffold directly fabricating by rapid prototyping: Preparation and in vitro experiment; Science Direct; Biomaterials 27 (2006) 1223-1235.

\* cited by examiner

COOLING ASSEMBLIES HAVING POROUS THREE DIMENSIONAL SURFACES

TECHNICAL FIELD

The present specification generally relates to cooling assemblies and, more particularly, to cooling assemblies having a porous three dimensional surface for enhanced nucleation.

BACKGROUND

Heat generating devices, such as power semiconductor devices, may be coupled to a heat spreader to remove heat and lower the maximum operating temperature of the heat generating device. In some applications, cooling fluid may be used to receive heat generated by the heat generating device by convective thermal transfer, and remove such heat from the heat generating device. In two-phase heat cooling devices, heat transfer is provided by the phase-change of the cooling fluid from a liquid to a vapor by nucleation. Rough or porous surfaces provide additional nucleation sites to encourage boiling. In addition to two-phase heat transfer, jet impingement may also be used to cool a heat generating device by directing impingement jets of cooling fluid onto the heat generating device or a target surface that is thermally coupled to the heat generating device.

Accordingly, a need exists for structures that provide for increased nucleation site density for enhanced thermal performance in two-phase cooling assemblies.

SUMMARY

In one embodiment, a cooling assembly includes a heat transfer substrate having a surface, a thermally conductive fin extending from the surface of the heat transfer substrate, and sintered metal particles bonded to the surface of the thermally conductive fin. The sintered metal particles define a micro-level porosity. An average diameter of the sintered metal particles increases from a base of the thermally conductive fin to a top of the thermally conductive fin.

In another embodiment, a cooling assembly includes a heat transfer substrate having a surface, an array of thermally conductive fins extending from the surface of the heat transfer substrate, and a metal mesh that is diffusion bonded to the array of thermally conductive fins and a surface of the heat transfer substrate between adjacent thermally conductive fins of the array of thermally conductive fins. The metal mesh defines a macro-porosity.

In yet another embodiment, a cooling assembly includes a heat transfer substrate having a surface, a thermally conductive fin extending from the surface of the heat transfer substrate, a metal mesh bonded to a surface of the thermally conductive fin, and sintered metal particles bonded to the metal mesh and the surface of the thermally conductive fin. The metal mesh defines a macro-level porosity, and the sintered metal particles define a micro-level porosity.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Referring generally to the figures, embodiments of the present disclosure are directed to two-phase cooling assemblies comprising a multiple-porosity, three-dimensional structure in the form of a heat sink on the heat transfer substrate that improves two-phase heat transfer by creating multiple sites for nucleate boiling to occur. In embodiments, a cooling fluid is introduced (e.g., by jet impingement or passive fluid flow) into a vapor chamber. A heat generating device, such as a power semiconductor device, heats the heat transfer substrate and the multiple-porosity heat sink such that cooling fluid present on the multiple-porosity heat sink changes phase from liquid to vapor, thereby removing heat flux from the heat transfer substrate. The multiple-level porosity heat sink comprises a macro-level porosity defined by a metal mesh (e.g., a copper mesh) bonded to one or more thermally conductive fins of heat sink, and a micro-level porosity defined by metal particles bonded to the metal mesh and the surface of the one or more fins. Accordingly, the multiple-level porosity structure has both a micro- and macro-level porosity to increase nucleation site density, increase available heat transfer area, provide for capillary assisted flow of cooling fluid, and provide additional paths for vapor to escape from the micro-level pores. Various embodiments of cooling assemblies and power electronics modules having multiple-level porosity heat sinks are disclosed.

Figure 1:
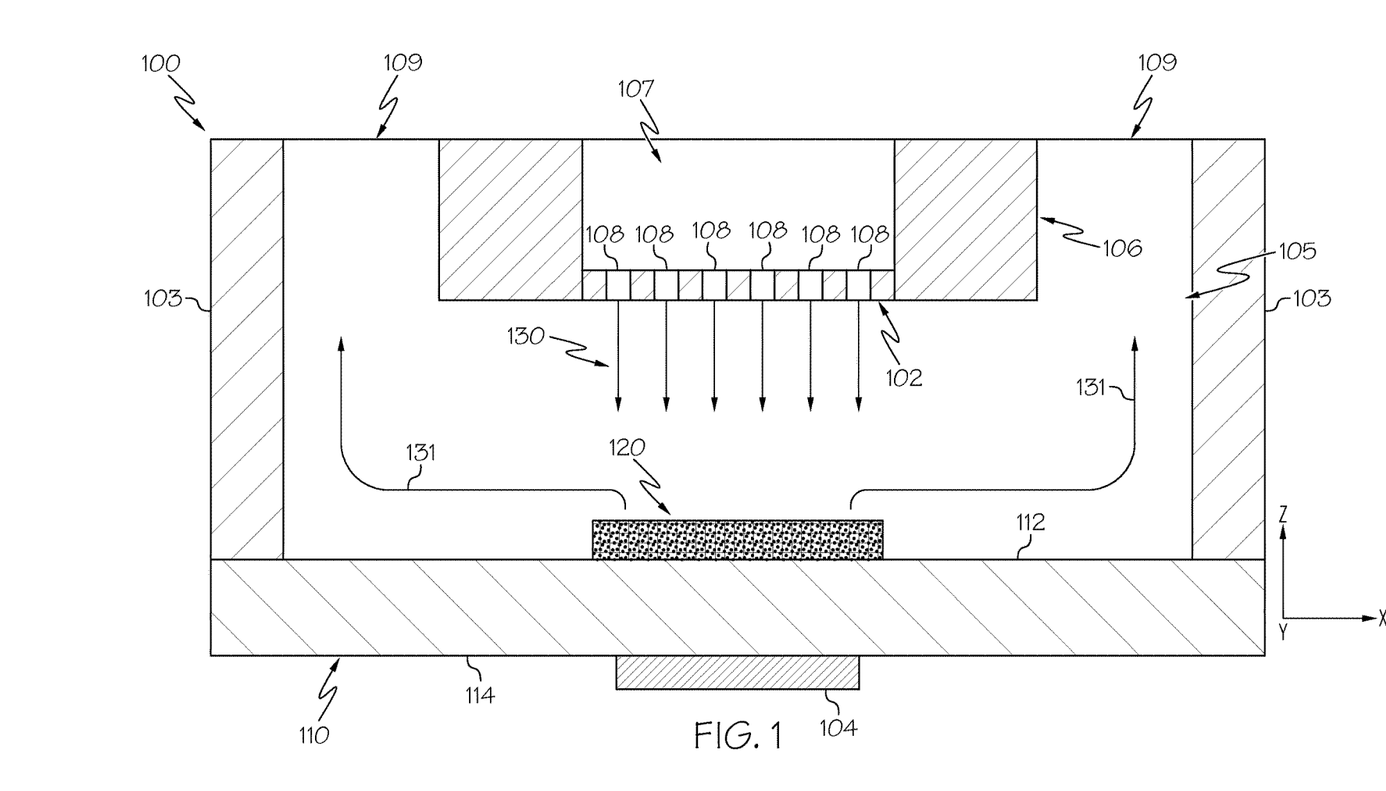
FIG. 1 schematically depicts a cross sectional view of a cooling assembly including a multiple-level porosity heat sink according to one or more embodiments described and illustrated herein.

Referring now to FIG. 1, an exemplary power electronics module 100 comprising a heat generating device 104 thermally coupled to a two-phase cooling assembly 101 is schematically depicted. The heat generating device 104 may be any device that generates heat, such as, for example, semiconductor devices. Semiconductor devices may include, but are not limited to, insulated gate bipolar transistors (IGBT), metal-oxide-semiconductor field effect transistors (MOSFET), power diodes, power bipolar transistors, power thyristor devices, and the like. As an example and not a limitation, the semiconductor device and associated power electronics module 100 may be included as a component in an inverter and/or converter circuit used to provide electrical power to high load devices, such as electric motors in electrified vehicles (e.g., hybrid vehicles, plug-in hybrid electric vehicles, plug-in electric vehicles, and the like). It should be understood that the cooling assemblies described herein may also be used to cool heat generating devices other than semiconductor devices (e.g., mechanical devices, such as motors).

The cooling assembly 101 generally includes a heat transfer substrate 110, an impingement chamber 105 defined in part by an assembly body 103, a multiple-level porosity heat sink 120 extending from a surface 112 of the heat transfer substrate 110, and an impingement jet assembly 106 configured to direct jets of cooling fluid 130 toward the multiple-level porosity heat sink. It is noted that the illustrated cooling assembly 101 is configured as an impingement jet device wherein the jets of cooling fluid 130 impinge the heat transfer substrate 110 and the multiple-level porosity heat sink 120. However, embodiments are not limited to impingement jet devices. For example, in an alternative embodiment, the cooling fluid may flow across the multiple-level porosity heat sink 120 without direct impingement.

The impingement jet assembly 106 includes a fluid input channel 107 through which cooling fluid flows from a fluid inlet (not shown). Examples of cooling fluids that may be used in conjunction with the cooling assembly 101 include a variety of fluids including, for example and without limitation, water, organic solvents, and inorganic solvents. Selection of the composition of the fluid used in association with the cooling assembly 101 may be selected based on, among other properties, the boiling point and the density of the fluid.

The impingement jet assembly 106 comprises a jet plate 102 having an array of orifices 108 through which the cooling fluid flows as high velocity impingement jets 130 that impinge the multiple-level porosity heat sink 120 and the first surface 112 of the heat transfer substrate. The heat flux provided by the heat generating device 104 changes the cooling fluid 130 from a liquid to a vapor 131 for two-phase heat transfer within the impingement chamber 105. The vapor 131 moves away from the multiple-level porosity heat sink 120 and flows toward a vapor outlet 109, which in the illustrated embodiment is located on a top surface of the cooling assembly 101. Alternatively, the vapor outlet 109 may be provided on one or more sides of the cooling assembly 101. As described in more detail below, the multiple levels of porosity of the multiple-level porosity heat sink 120 assists in the boiling of the cooling fluid. The vapor may be condensed and then returned to the cooling assembly 101 in a closed-loop system.

The impingement chamber 105 is defined by the heat transfer substrate 110, the assembly body 103, and the impingement jet assembly 106. The assembly body 103, which may also be fabricated from a thermally conductive material in some embodiments, may be bonded to the heat transfer substrate 110. Alternatively, the assembly body 103 and the heat transfer substrate 110 may be configured as a single, integral component.

Figure 2A:
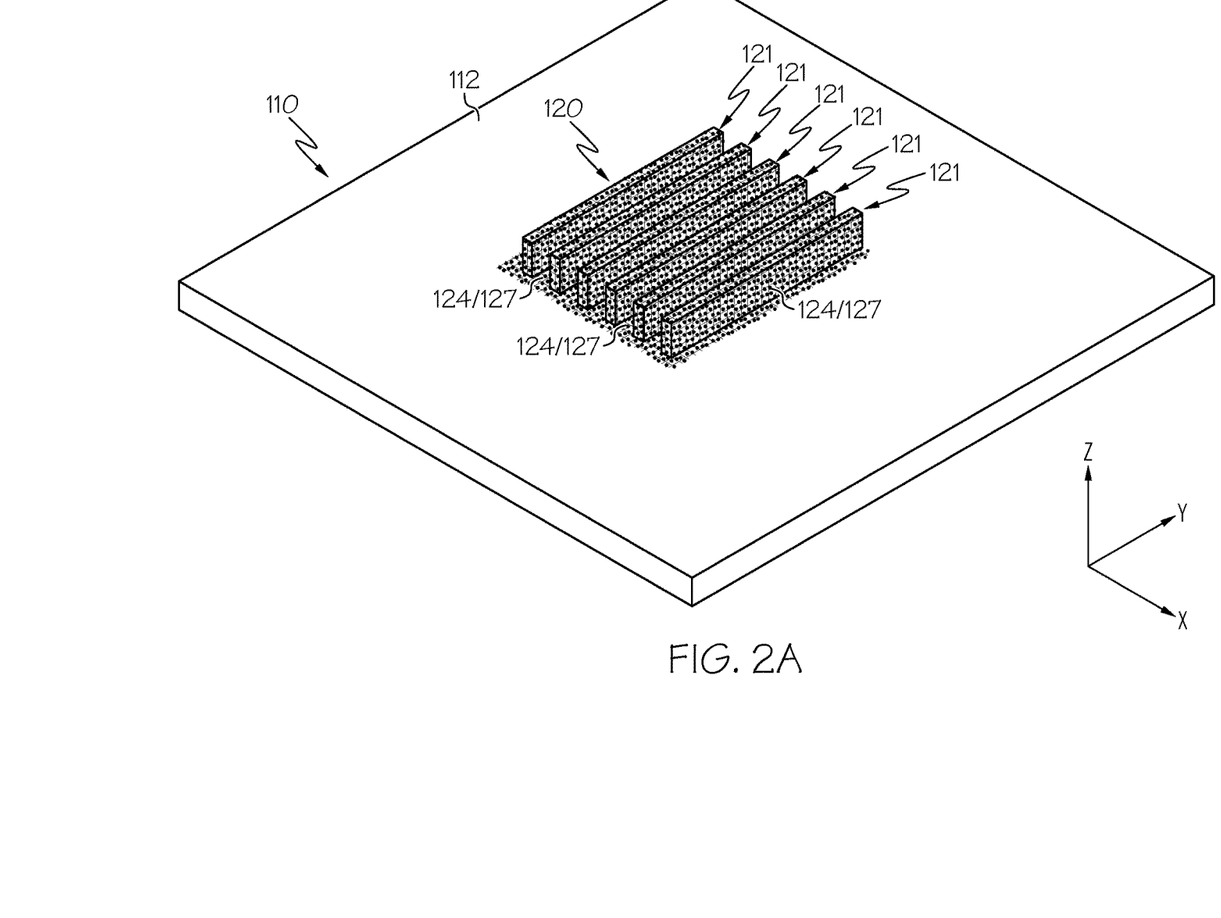
FIG. 2A schematically depicts a top-down perspective view of a multiple-level porosity heat sink on a surface of a heat transfer substrate of a cooling assembly according to one or more embodiments described and illustrated herein.
Figure 2B:
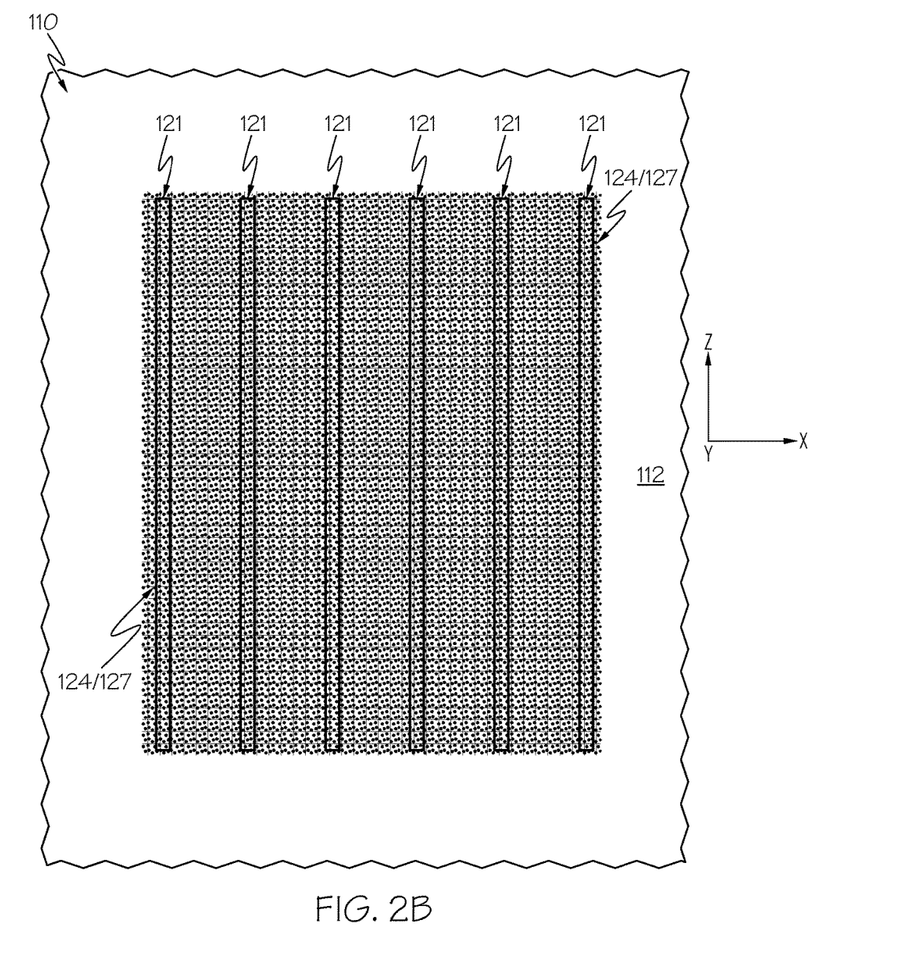
FIG. 2B schematically depicts a top-down view of the multiple-level porosity heat sink on the surface of the heat transfer substrate depicted in FIG. 2A.

Referring to FIGS. 2A and 2B, the heat transfer substrate 110 includes a first surface 112 (i.e., a target surface that receives the cooling fluid) and a second surface 114 (i.e., a heat transfer surface). FIG. 2A is a perspective view and FIG. 2B is a top-down view of the heat transfer substrate 110. The heat generating device 104 is thermally coupled to the second surface 114 of the heat transfer substrate 110 by any appropriate method including, but not limited to, solder, thermal paste, brazing, clamping and the like. The heat transfer substrate 110 may be made of a thermally conductive material (e.g., a metal or metal alloy) to receive heat flux created by the heat generating device 104. Exemplary materials for the heat transfer substrate 110 include, but are not limited to, copper, aluminum, gold, alumina, and aluminum nitride.

A three-dimensional structure, which in the illustrated embodiment is a straight-finned heat sink comprising an array of thermally conductive fins 121, extends from the first surface 112 of the heat transfer substrate 110. It should be understood that embodiments are not limited to the configuration of the array of fins 121, as other configurations are also possible. Any number of fins 121 may be provided in any shape (e.g., pin fins, curvy fins). In some embodiments, the array of fins 121 is an integral component with the heat transfer substrate 110 (e.g., the array of fins 121 are machined, etched, or otherwise formed within the first surface 112). In other embodiments, the individual fins or the array of fins 121 are separate components that are bonded to the first surface 112 of the heat transfer substrate 110 (e.g., by soldering, brazing, etc.). In embodiments, the array of fins 121 may be made of the same thermally conductive material as the heat transfer substrate 110.

A metal mesh 124 is bonded to the array of fins 121 and the first surface 112 of the heat transfer substrate 110. The metal mesh 124, which may be in the form of a single layer of metal mesh or multiple, discrete mesh sections, provide a macro-level porosity for the multiple-level porosity heat sink 120 to enhance thermal performance. Although FIGS. 2A and 2B depicts a single, continuous metal mesh 124 bonded to the surfaces of the fins 121 and the first surface 112 between adjacent fins 121 (i.e., a base surface of the heat sink 120), embodiments are not limited thereto. For example, a metal mesh 124 may be applied to some, but not all, of the fins 121. As another non-limiting example, the metal mesh 124 may only be applied to the surfaces of the fins 121 and not to the first surface 112 of the heat transfer substrate 110. Other configurations are also possible.

As described in more detail below with reference to FIG. 5, one or more layers of small metal particles 127 are bonded to the metal mesh, the array of fins 121, and the first surface 112 of the heat transfer substrate 110. The small metal particles 127, which may have an average size between about 10 µm and about 200 µm, for example, provide a micro-level porosity for the multiple-level porosity heat sink 120. Accordingly, the metal mesh 124 provides a macro-level porosity and the metal particles 127, which are sintered as described below, provide the micro-level porosity.

Figure 3:
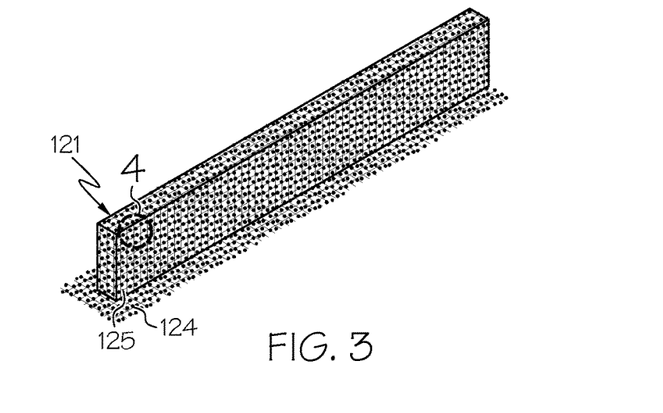
FIG. 3 schematically depicts a close-up perspective view of a single fin of the multiple-level porosity heat sink depicted in FIGS. 1-2B according to one or more embodiments described and illustrated herein.
Figure 4:
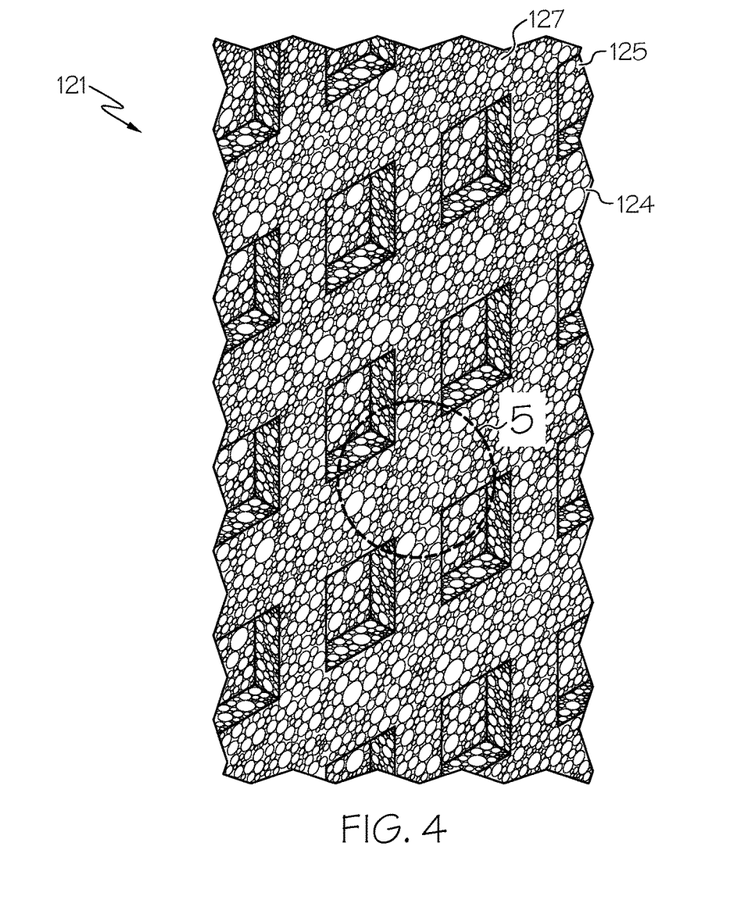
FIG. 4 schematically depicts a close-up perspective view of encircled region 4 of the metal mesh depicted in FIG. 3 according to one or more embodiments described and illustrated herein.

FIG. 3 depicts a perspective view of a single fin 121 of the heat transfer substrate 110 depicted in FIGS. 1, 2A, and 2B. FIG. 4 depicts a close-up perspective view of a portion of the metal mesh 124 shown in FIG. 3. As shown in FIG. 3, the metal mesh 124 may be disposed on some or all surfaces 125 of the fin(s) 121, as well as on portions of the first surface 112 of the heat transfer substrate 110, such as between adjacent fins 121 and region extending beyond the first and last fins 121. The metal mesh 124 may be bonded to the fins 121 and the first surface 112 by diffusion bonding, for example. It is noted that the metal mesh 124 is illustrated schematically in the figures, and the pitch of the metal mesh may be smaller than depicted throughout the figures.

In embodiments, the metal mesh 124 is fabricated from the same thermally conductive material as the fins 121. In one non-limiting example, the heat transfer substrate 110, the fins 121, and the metal mesh 124 are fabricated from copper. It should be understood that other thermally conductive materials (e.g., metals or metal-alloys) may be utilized.

As shown in FIG. 4, the metal mesh 124 comprises open cells 123 that define the macro-level porosity. The thickness of the metal material of the metal mesh 124 and the size of the open cells 123 depends on the desired macro-level porosity. In embodiments, the metal mesh 124 may provide a macro-level porosity of about 50%. Other porosities may be provided depending on the desired heat transfer characteristics of the cooling assembly 101. Any suitable metal mesh material may be used. Two non-limiting examples include #100 copper mesh and #200 copper mesh (or other thermally conductive material). Metal meshes having a geometric configuration different from that illustrated in FIG. 4 may also be utilized.

It is noted that the open cells 123 of the metal mesh provide for increased heat transfer surface area as well as increased nucleation sites.

Figure 5:
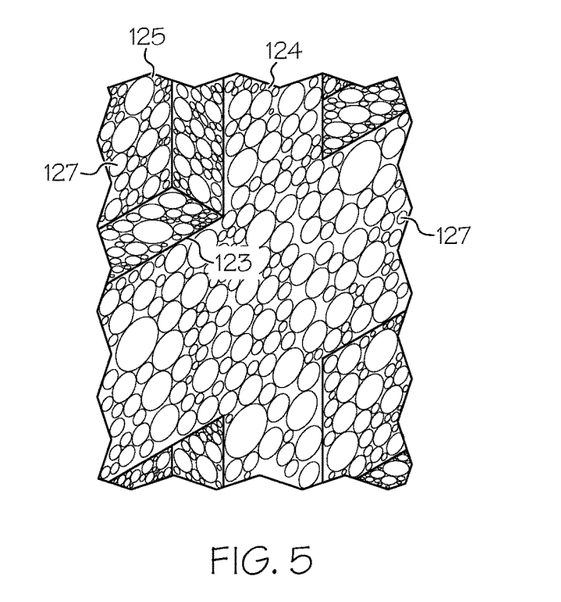
FIG. 5 schematically depicts a close-up perspective view of encircled region 5 of the metal mesh depicted in FIG. 4 according to one or more embodiments described and illustrated herein.

Referring now to FIG. 5, the small metal particles 127 are bonded to the metal mesh 124 and the surface 125 of the fins 121 by a sintering and/or diffusion bonding process, as described in more detail below. FIG. 5 is a close-up perspective view of a metal mesh 124 and metal particles applied to a surface 125 of an individual fin 121. Although not shown in FIG. 5, the metal particles 127 may also be bonded to the first surface 112 of the heat transfer substrate 110 (see FIGS. 2A and 2B).

In embodiments, the metal particles 127 are sintered on the metal mesh 124, the surfaces 125 of the fins 121, and the first surface 112 of the heat transfer substrate 110 and form a layer of metal particles 127 thereon. As described in more detail below, the metal particles 127 may be provided in a metal powder or slurry that applied to the appropriate surfaces and then subjected to a heat treatment process. The material of the metal particles is capable to be bonded to the fins 121, the metal mesh 124, and the heat transfer substrate 110 using a heat treatment process. In embodiments, the metal particles are made from the same material as the fins 121 and the metal mesh 124. As a non-limiting example, the heat transfer substrate 110, the fins 121, the metal mesh 124, and the metal particles are fabricated from copper.

The size of the metal particles 127 used may depend on the desired micro-level porosity of multiple-level porosity heat sink 120. As an example and not a limitation, the average size of the metal particles may be between about 10 µm and about 200 µm, and the micro-level porosity provided by the sintered metal particles may be between about 50% and about 60%. Embodiments are not limited to any thickness of the layer of metal particles 127. The metal particles 127 may be provided in a 0.250 mm thick layer in one non-limiting example.

Embodiments described herein are not limited to both macro- and micro-levels of porosity. For example, in alternative embodiments, only the metal mesh 124 may be provided such that the heat sink 120 has only the macro-level porosity described above. In such embodiments, the metal mesh 124 is bonded to a three-dimensional surface (e.g., fins and base surface of a heat sink 120) to provide additional surface area and nucleating sites on the three-dimensional surface. The metal mesh 124 may be bonded to the three dimensional surface by diffusion bonding, as described above.

Figure 6:
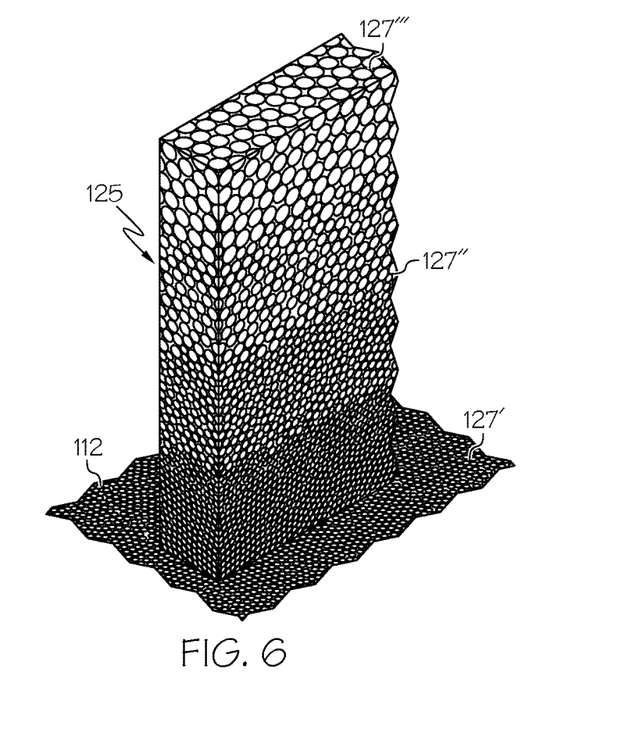
FIG. 6 schematically depicts a partial perspective view of a fin having variably sized metal particles that define a porosity gradient according to one or more embodiments described and illustrated herein.

In other embodiments, only the metal particles 127 are provided such that the heat sink 120 only has the micro-level porosity described above. In such embodiments, the metal mesh 124 is not provided. The metal particles 127 are bonded (e.g., by sintering and/or diffusion bonding) to a three-dimensional surface (e.g., fins and base surface of a heat sink 120) to provide a three-dimensional, micro-porous surface that increases nucleating site density. Referring to FIG. 6, In some embodiments, size and/or distribution of the metal particles 127', 127", 127''' may be controlled to achieve a desired porosity gradient on the surface 125 of the fins 121. The porosity gradient may be provided to achieve a capillary pumping effect to move coolant in a desired manner. As an example and not a limitation, the metal particles on the first surface 112 of the heat transfer substrate 110 and regions on the surfaces 125 of the fins 121 close to the first surface 112 (i.e., particles 127' at a base of the fins 121) may have an average size that is smaller than the size of the metal particles 127''' near or at the top of the fins 121 (e.g., the size of the metal particles may increase from about 10 µm near the first surface to about 200 µm near the top of each fin 121). Accordingly, the size of the metal particles may gradually increase to provide an increasing porosity gradient from the first surface 112 to the top of the fins 121. It should be understood that the porosity gradient may also be utilized in embodiments including the metal mesh 124.

Referring generally to FIGS. 1-5, the functionality of the power electronics module 100 including the cooling assembly 101 will now be described. Jets of cooling fluid 130 exit the orifices 108 of the impingement jet assembly 106 and impinge the multiple-level porosity heat sink 120 and the first surface 112 of the heat transfer substrate 110. As stated above, in other embodiments, the cooling fluid may be introduced in a non-impinging manner (e.g., through an inlet that allows the cooling fluid to flow across the first surface 112 of the heat transfer substrate 110). The heat transfer substrate 110 and the multiple-level porosity heat sink 120 are at an elevated temperature due to the heat flux generated by the heat generating device 104. Heat is transferred from the multiple-level porosity heat sink 120 and the heat transfer substrate 110 to the cooling fluid 130 upon impingement and flow within the multiple-level porosity heat sink 120 and on the first surface 112.

The high temperature causes the cooling fluid 130 to change phase from a liquid to a vapor within the impingement chamber 105. The micro-level porosity of the sintered metal particles 127 provide for increased nucleating site density over a flat, non-porous surface, thereby promoting nucleation. The three dimensional, open cell structure of the metal mesh 124 provides for increased surface area for nucleation and heat transfer to the cooling fluid. Further, the three-dimensional arrangement provided by the fins 121 of the multiple-level porosity heat sink 120 also provides increase heat transfer area and additional nucleation sites. Both the micro-level porosity and the macro-level porosity of the multiple-level porosity heat sink 120 provides volume for the vapor to escape from the multiple-level porosity heat sink 120 and away from the heat generating device 104, thereby increasing heat transfer efficiency. Further, the micro-level porosity of the multiple-level porosity heat sink 120 provides heat transfer enhancement due to the capillary assisted flow of coolant fluid. In embodiments, as shown in FIG. 1, vapor may be removed from the impingement chamber 105 through one or more vapor outlets 109.

Figure 7:
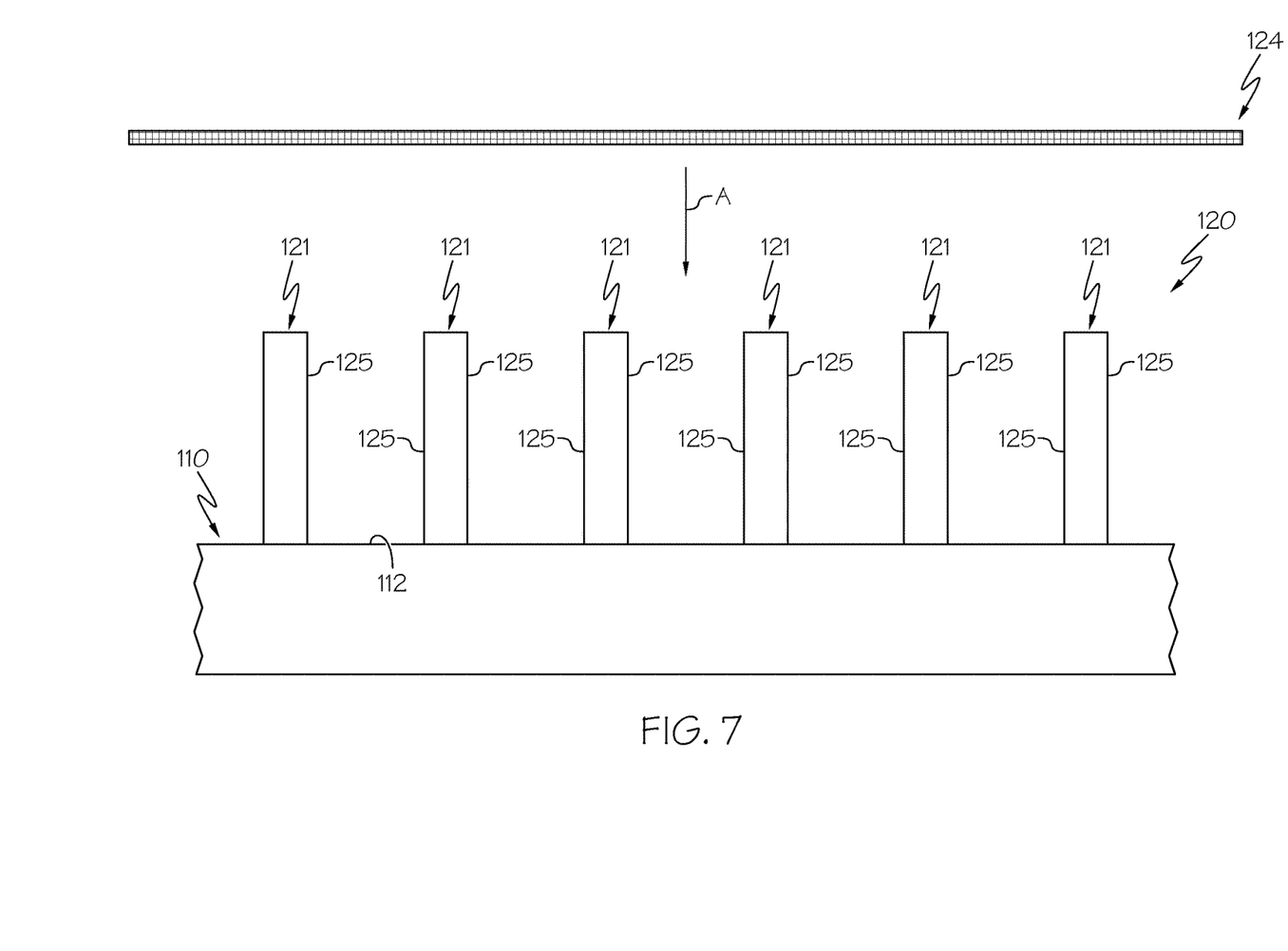
FIG. 7 schematically depicts a metal mesh being applied to fins of a heat sink on a heat transfer substrate according to one or more embodiments of methods of fabricating a multiple-level porosity heat sink of a cooling assembly.

An example method of fabricating a cooling assembly 101 having a multiple-level porosity heat sink 120 will now be described with reference to FIGS. 7-10. FIG. 7 depicts a partial side view of a heat transfer substrate 110 with an array of fins 121 defining a heat sink 120 extending from a first surface 112. As described above, the fins 121 and the heat transfer substrate 110 may be provided as an integral component. The fins 121 and heat transfer substrate 110 may be any appropriate thermally conductive metal or metal alloy. In a specific non-limiting example, the fins 121 and the heat transfer substrate are fabricated from copper. Each of the fins 121 has an external surface 125 to which the metal mesh 124 and metal particles will be applied.

FIG. 7 also depicts a metal mesh 124 as described above prior to being positioned on the fins 121. The metal mesh 124 may be automatically (i.e., by a robot or an automated machine) or manually (i.e., by human operator) moved toward the fins 121 and the heat transfer substrate 110 as indicated by arrow A.

Figure 8:
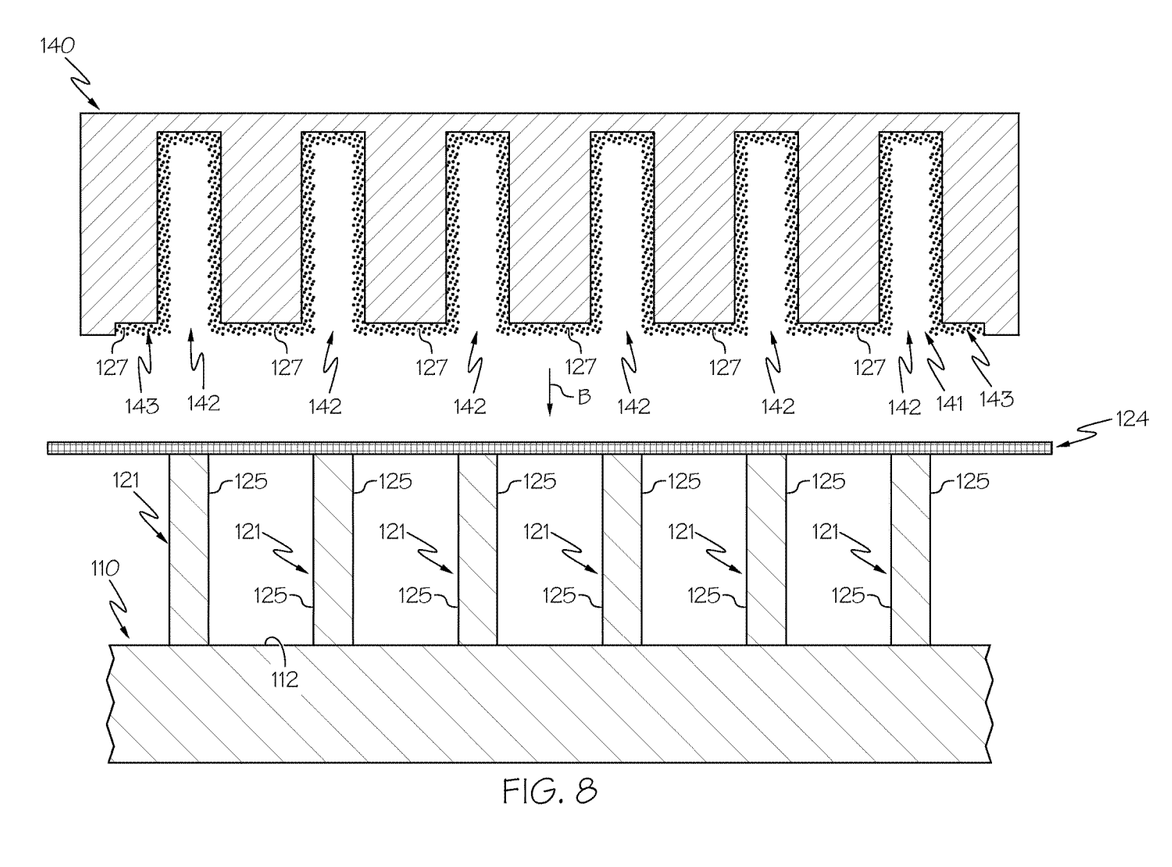
FIG. 8 schematically depicts a metal mesh and a fixture containing metal particles being applied to fins of the heat sink on the heat transfer substrate depicted in FIG. 7 according to one or more embodiments of methods of fabricating a multiple-level porosity heat sink of a cooling assembly.

Referring now to FIG. 8, the metal mesh 124 is depicted as resting on a top surface of the fins 121. Alternatively, the metal mesh 124 may be prepositioned between adjacent fins 121 rather than only resting on top. A fixture 140 having an inverse geometry from the array of fins 121 and the first surface 112 of the heat transfer substrate 110 is provided. More specifically, the fixture 140 includes a recessed portion 141 having an array of openings 142 spaced and configured to receive the array of fins 121. The fixture 140 may be fabricated from any appropriate mold material such as, without limitation, ceramic material.

Metal particles 127 of the desired size and concentration are provided within the array of openings 142 as well as in a secondary recessed area 143 to apply the metal particles 127 to the first surface 112 of the heat transfer substrate 110. The metal particles 127 may be provided in the recessed portion 141 as a metal powder, for example. Alternatively, the metal particles 127 may be provided in a metal particle slurry comprising metal powder and a binder (or a binder and a dispersant). It is noted that, in some embodiments, the metal particles 127 may be provided on the fins 121 themselves in addition to, or in lieu of, being provided in the recessed portion 141 as shown in FIG. 8. Additionally, the metal mesh 124 may be partially disposed in the openings 142 of the fixture 140 prior to positioning the fixture 140 on the array of fins 121 rather than initially providing the metal mesh 124 on the fins 121 as shown in FIG. 8.

The fixture 140 is then automatically or manually moved toward the fins 121 and the heat transfer substrate 110 as indicated by arrow B.

Figure 9:
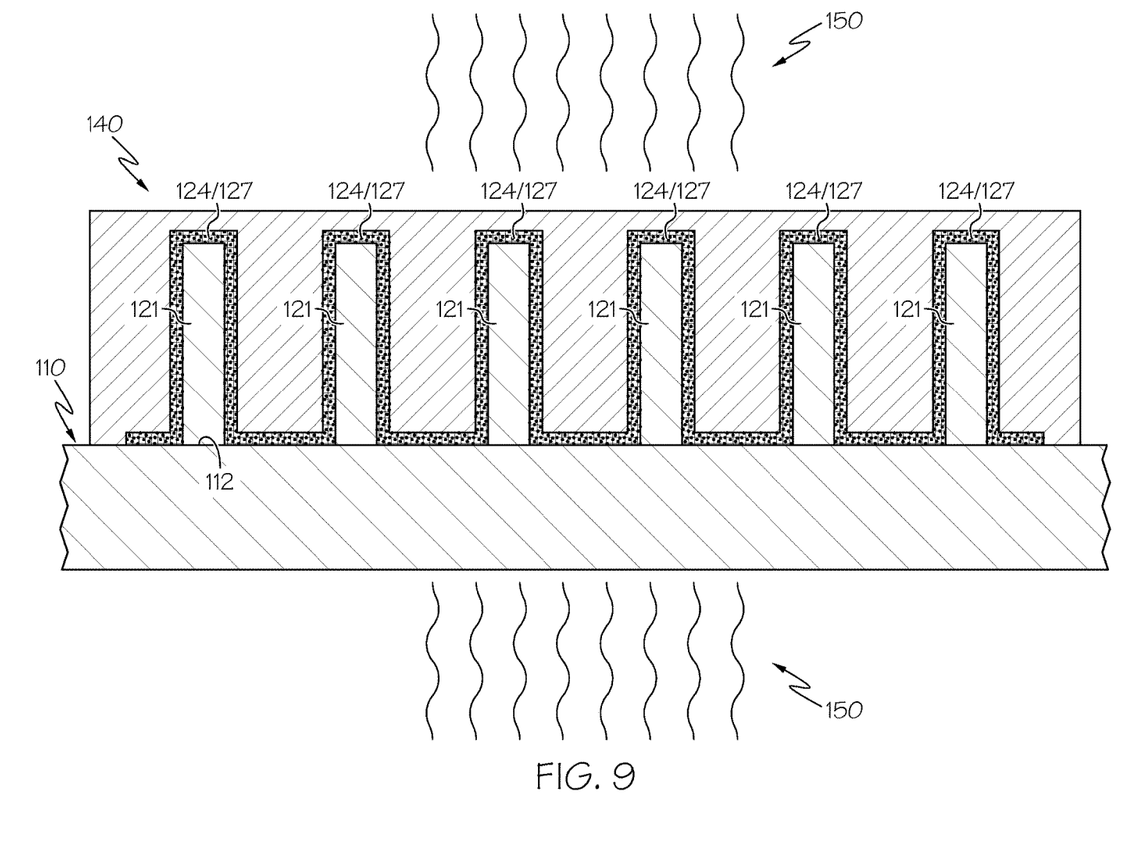
FIG. 9 schematically depicts a heat treatment process of bonding the metal mesh and metal particles to the fins and the surface of the heat transfer substrate depicted in FIGS. 7 and 8 according to one or more embodiments of methods of fabricating a multiple-level porosity heat sink of a cooling assembly.

Referring now to FIG. 9, the fins 121, metal mesh 124 and metal particles 127 are disposed within the recessed portion 141 in close proximity with the interior surfaces of the fixture 140. Accordingly, the fixture 140 assists in maintaining the metal mesh 124 and the metal particles 127 on the surfaces 125 of the fins 121 and the first surface 112 of the heat transfer substrate 110.

After the fixture 140 is positioned on the fins 121 and the heat transfer substrate 110, the assembly is subjected to a heat treatment process to sinter the metal particles 127, and bond the metal mesh 124 and the metal particles to the surfaces 125 of the fins 121 and the first surface 112 of the heat transfer substrate 110 by diffusion bonding. Thermal energy (schematically depicted as lines 150) is applied to the assembly (i.e., the heat transfer substrate 110, fins 121, metal mesh 124, and metal particles 127) to raise the temperature of the assembly to a bonding temperature. The assembly is maintained at the bonding temperature for a bonding duration to both sinter the metal particles 127 and to diffusion bond the metal mesh 124 and the metal particles 127 to the surfaces 125 of the fins 121 and the heat transfer substrate 110. The bonding temperature should be close to the melting temperature of the thermally conductive material of the heat transfer substrate 110, the fins 121, the metal mesh 124, and the metal particles 127. Accordingly, the bonding temperature and duration depends on the material chosen. The bonding temperature and duration should be such that the metal mesh 124 and the metal particles 127 are bonded to the surfaces 125 of the fins 121 and the first surface 112 of the heat transfer substrate 110 with the desired micro-level porosity.

Figure 10:
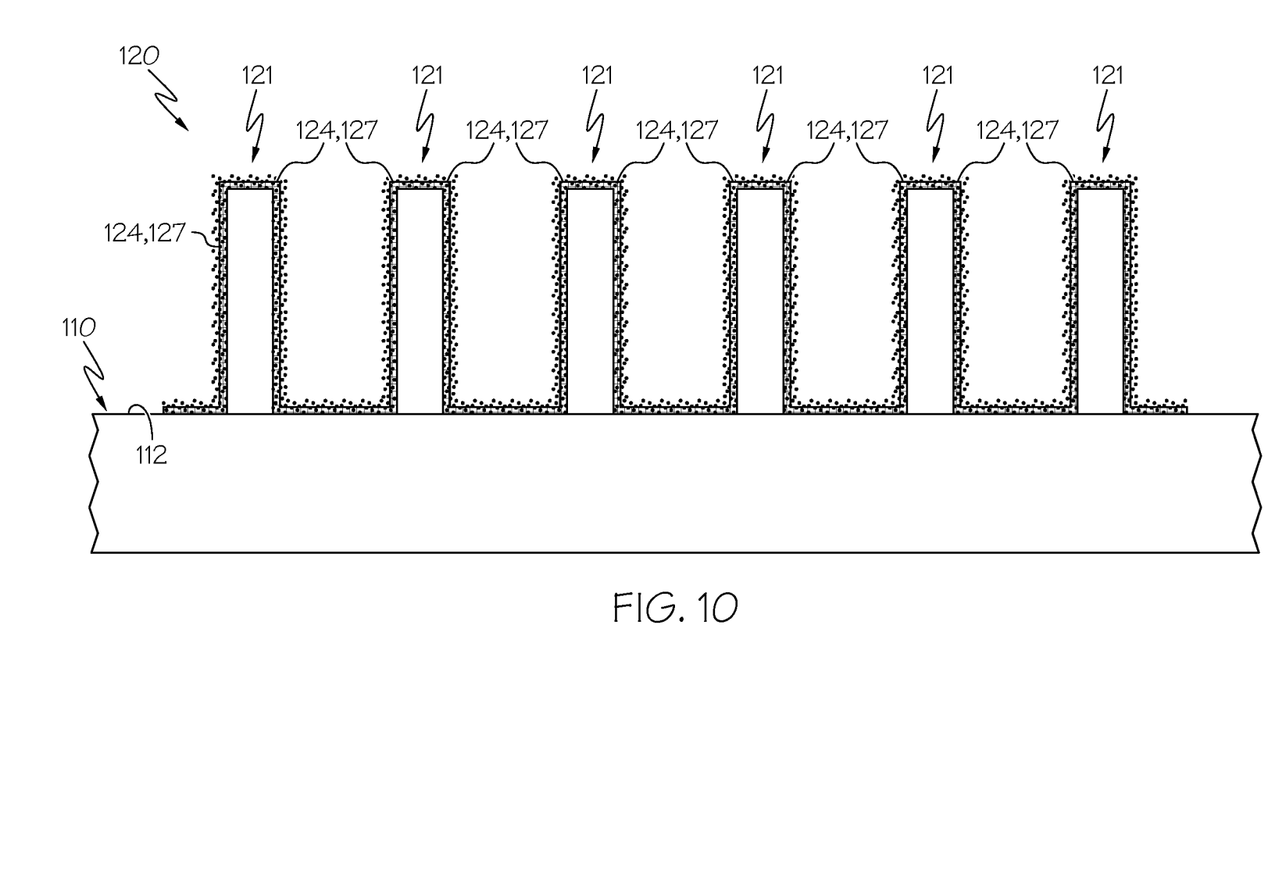
FIG. 10 schematically depicts a multiple-level porosity heat sink on a heat transfer substrate after removal of the fixture upon completion of the heat treatment process depicted in FIG. 9 according to one or more embodiments of methods of fabricating a multiple-level porosity heat sink of a cooling assembly.

In embodiments, the fixture 140 may remain on the fins 121 and the heat transfer substrate 110 while the assembly cools to a desired cooled temperature. For example, the assembly may be allowed to cool at room temperature until the assembly is at room temperature. After the assembly is cooled to the desired cooled temperature, the fixture 140 is removed from the fins 121 and the heat transfer substrate 110. FIG. 10 schematically depicts a side view of a completed heat transfer substrate 110 and multiple-level porosity heat sink 120 after heat treatment and removal of the fixture 140. It is noted that the metal mesh 124 and the layer of metal particles 127 are illustrated schematically for illustration purposes only, and that embodiments are not limited to the schematic representation of the figures.

The metal mesh 124 and the layer of metal particles 127 are provided on the surfaces 125 of the fins 121 and the first surface 112 of the heat transfer substrate 110 to provide a multiple-level porosity heat sink 120 having a macro-level and a micro-level porosity.

Figure 11:
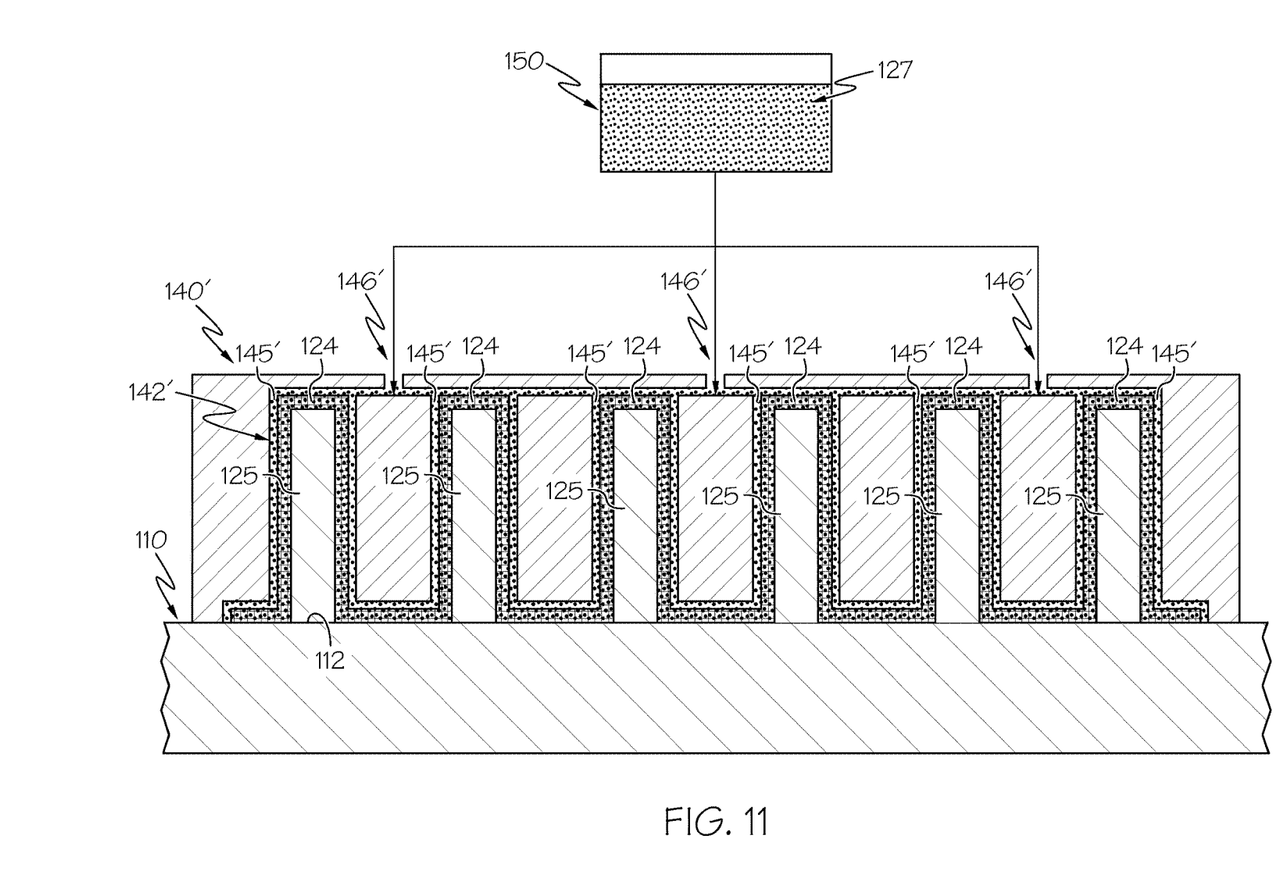
FIG. 11 schematically depicts a fixture and metal mesh applied to the fins and the surface of the heat transfer substrate wherein metal particles are subsequently applied to a cavity of the fixture through one or more inlets according to one or more embodiments.

FIG. 11 depicts an alternative method of fabricating a cooling assembly 101. Rather than providing the metal particles 127 in the fixture 140 prior to applying the fixture 140 to the fins 121 and the first surface 112 of the heat transfer substrate 110, the metal particles 127 may be introduced into the fixture 140 after placing the fixture 140 on the fins 121 and the first surface 112. FIG. 11 depicts a fixture 140' applied to the fins 121 and the first surface 112 of a heat transfer substrate 110 in cross section. The openings 142' of the fixture 140' are sized such that a gap 145' is present between an interior surface of the fixture 140' and the metal mesh 124 and/or the fins 121. The openings 142' are fluidly coupled to one another by a channel 144' extending within the fixture proximate a first surface 141'. One or more inlets 146' are disposed within the first surface 141' of the fixture 140'. The one or more inlets 146' are fluidly coupled to the channel 144' and the openings 142'. It should be understood that any number of inlets 146' may be provided. Further, the one or more inlets 146' may be positioned on a surface other than the first surface 141' as depicted in FIG. 11 (e.g., on one or more sides of the fixture 140').

The one or more inlets 146' are provided to introduce the metal particles 127 (e.g., in the form of a metal particle powder) into the channel 144' and the openings 142'. As shown in FIG. 11, the metal particles 127 may be disposed within a metal particle source 150 and introduced into the fixture 140' through the one or more inlets 146' as indicated by the arrows. The metal particles 127 may be encouraged by gravity to fill in the gaps 145' as well as within the metal mesh 124. In some embodiments, the fixture 140' may be vibrated or otherwise translated into in two or three dimensions to encourage the metal particles 127 to fully fill the fixture for equal distribution. After the fixture 140' is filled with metal particles 127, the fixture 140' may be subjected to a heat treatment process to bond the metal particles 127 and the metal mesh 124 to the fins 125 and the first surface 112 of the heat transfer substrate 110 as described above and depicted in FIG. 9.

It should now be understood that embodiments described herein are directed to two-phase cooling assemblies including at least one multiple-level porosity, three-dimensional heat sink comprising one or more fins extending from a surface of a heat transfer substrate, a metal mesh, and a layer of small metal particles. The metal mesh and the small metal particles are bonded to at least the fin(s) to provide macro-level and micro-level porosity, respectively. The multiple-level porosity attributes of the heat sink may improve two-phase heat transfer by creating multiple sites for nucleate boiling to occur, increase available heat transfer area, provide enhancement due to capillary assisted flow, and provide additional paths for vapor to escape. In some embodiments, only a metal mesh providing a macro-level porosity is bonded to the heat sink, while in other embodiments, only the metal particles provide a micro-level porosity is bonded to the heat sink. A porosity gradient of the micro-level porosity may be utilized by varying the size and distribution of the metal particles to achieve a desired capillary pumping effect to further increase thermal performance of the multiple-level porosity heat sink.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A cooling assembly comprising:
   a heat transfer substrate having a surface;
   a thermally conductive fin comprising one or more surfaces, the thermally conductive fin extending from the surface of the heat transfer substrate;
   a metal mesh that is diffusion bonded to each of the one or more surfaces of the thermally conductive fin, the metal mesh conforming entirely to each of the one or more surfaces of the thermally conductive fin and defining a macro-porosity; and
   sintered metal particles that are at least one of sintered and diffusion bonded to the surfaces of the thermally conductive fin to form a layer of sintered metal particles, wherein:
   the sintered metal particles define a micro-level porosity; and
   an average diameter of the sintered metal particles increases from a base of the thermally conductive fin to a top of the thermally conductive fin.

2. The cooling assembly of claim 1, wherein the thermally conductive fin is an individual thermally conductive fin of an array of thermally conductive fins extending from the surface of the heat transfer substrate, and the layer of sintered metal particles is bonded to each thermally conductive fin of the array of thermally conductive fins.

3. The cooling assembly of claim 2, wherein the layer of sintered metal particles is bonded to the surface of the heat transfer substrate between adjacent thermally conductive fins of the array of thermally conductive fins.

4. The cooling assembly of claim 1, wherein the heat transfer substrate, the thermally conductive fin, and the sintered metal particles are made of copper.

5. The cooling assembly of claim 1, wherein the sintered metal particles have an average diameter between about 40 μm and about 150 μm.

6. The cooling assembly of claim 1, further comprising an impingement jet assembly comprising a fluid inlet channel fluidly coupled to an array of orifices provided in a jet plate, wherein the jet plate is offset from the heat transfer substrate.

7. A cooling assembly comprising:
   a heat transfer substrate having a surface;
   an array of thermally conductive fins comprising one or more surfaces, the array of thermally conductive fins being integrally formed with and extending from the surface of the heat transfer substrate; and
   a metal mesh that is diffusion bonded to the surfaces of the array of thermally conductive fins and a surface of the heat transfer substrate between adjacent thermally conductive fins of the array of thermally conductive fins, the metal mesh conforming entirely to each of the one or more surfaces of the array of thermally conductive fins and defining a macro-porosity.

8. The cooling assembly of claim 7, wherein the heat transfer substrate, the array of thermally conductive fins, and the metal mesh are made of copper.

9. The cooling assembly of claim 7, wherein the metal mesh is at least 50% porous.

10. The cooling assembly of claim 7, further comprising an impingement jet assembly comprising a fluid inlet channel fluidly coupled to an array of orifices provided in a jet plate, wherein the jet plate is offset from the heat transfer substrate.

11. A cooling assembly comprising:
    a heat transfer substrate having a surface;
    a thermally conductive fin comprising one or more surfaces, the thermally conductive fin extending from the surface of the heat transfer substrate;
    a metal mesh bonded to each of the one or more surfaces of the thermally conductive fin, the metal mesh conforming entirely to each of the one or more surfaces of the thermally conductive fin and defining a macro-level porosity; and
    sintered metal particles that are at least one of sintered and diffusion bonded to the metal mesh and the surfaces of the thermally conductive fin to form a layer of sintered metal particles, the sintered metal particles defining a micro-level porosity, wherein an average diameter of the sintered metal particles increases from a base of the thermally conductive fin to a top of the thermally conductive fin.

12. The cooling assembly of claim 11, wherein the metal mesh and the layer of sintered metal particles are disposed on at least a portion of the surface of the heat transfer substrate.

13. The cooling assembly of claim 11, wherein the thermally conductive fin is an individual thermally conductive fin of an array of thermally conductive fins extending from the surface of the heat transfer substrate, and the metal mesh and the layer of sintered metal particles are bonded to each thermally conductive fin of the array of thermally conductive fins.

14. The cooling assembly of claim 13, wherein the metal mesh and the layer of sintered metal particles are bonded to the surface of the heat transfer substrate between adjacent thermally conductive fins of the array of thermally conductive fins.

15. The cooling assembly of claim 11, wherein the metal mesh is bonded to the each of the one or more surfaces of the thermally conductive fin by diffusion bonding.

16. The cooling assembly of claim 11, wherein the heat transfer substrate, the thermally conductive fin, the metal mesh, and the sintered metal particles are made of copper.

17. The cooling assembly of claim 11, wherein the sintered metal particles have an average diameter between about 40 μm and about 150 μm.

18. The cooling assembly of claim 11, further comprising an impingement jet assembly comprising a fluid inlet channel fluidly coupled to an array of orifices provided in a jet plate, wherein the jet plate is offset from the heat transfer substrate.

19. The cooling assembly of claim 1, wherein the layer of sintered metal particles are at least one of diffusion sintered and diffusion bonded to a top surface and peripheral surfaces of the thermally conductive fin and the layer of sintered metal particles comprises a thickness that is constant along the peripheral and top surfaces of the fin.

20. The cooling assembly of claim 19, wherein the thickness of the layer of sintered metal particles is about 0.25 mm.

21. The cooling assembly of claim 2, wherein layers of sintered metal particles on opposing surfaces of two adjacent thermally conductive fins of the array of thermally conductive fins are spaced apart from one another.

* * * * *